US008553338B1

(12) United States Patent
Geng

(10) Patent No.: US 8,553,338 B1
(45) Date of Patent: Oct. 8, 2013

(54) NON-IMAGING FREEFORM OPTICAL DEVICE FOR USE IN A HIGH CONCENTRATION PHOTOVOLTAIC DEVICE

(76) Inventor: Zheng Jason Geng, Rockville, MD (US)

( * ) Notice: Subject to any disclaimer, the term of this patent is extended or adjusted under 35 U.S.C. 154(b) by 443 days.

(21) Appl. No.: 12/871,498

(22) Filed: Aug. 30, 2010

Related U.S. Application Data

(60) Provisional application No. 61/237,732, filed on Aug. 28, 2009.

(51) Int. Cl.
*G02B 17/00* (2006.01)
*G02B 13/18* (2006.01)
*G02B 3/06* (2006.01)

(52) U.S. Cl.
USPC .......................................... 359/727; 359/712

(58) Field of Classification Search
USPC ................ 359/708, 742, 627, 726–728, 712;
362/341, 347, 317
See application file for complete search history.

(56) References Cited

U.S. PATENT DOCUMENTS

| | | | |
|---|---|---|---|
| 3,628,851 A | 12/1971 | Robertson | |
| 3,881,811 A | 5/1975 | French | |
| 4,258,979 A | 3/1981 | Mahin | |
| 4,449,786 A | 5/1984 | McCord | |
| 5,321,556 A | 6/1994 | Joe | |
| 6,064,423 A | 5/2000 | Geng | |
| 6,179,426 B1 | 1/2001 | Rodriguez, Jr. | |
| 6,439,729 B2 | 8/2002 | Koukichi | |
| 6,545,810 B1 | 4/2003 | Togino et al. | |
| 6,583,940 B2 | 6/2003 | Nishikawa et al. | |
| 6,779,897 B2 | 8/2004 | Konno et al. | |
| 7,520,641 B2 | 4/2009 | Minano et al. | |
| 7,562,987 B2 | 7/2009 | McDowall | |
| 7,591,560 B2 | 9/2009 | Yamamoto | |
| 7,967,448 B2 | 6/2011 | Destain | |
| 2003/0071891 A1 | 4/2003 | Geng | |
| 2003/0177164 A1 | 9/2003 | Savov et al. | |
| 2006/0139577 A1 | 6/2006 | Ikeda et al. | |
| 2006/0221309 A1 | 10/2006 | Onishi et al. | |
| 2008/0002158 A1 | 1/2008 | Matsuoka | |
| 2008/0030573 A1 | 2/2008 | Ritchey | |
| 2008/0223443 A1* | 9/2008 | Benitez et al. | 136/259 |
| 2009/0225457 A1 | 9/2009 | Chuang | |
| 2010/0192941 A1* | 8/2010 | Stoia et al. | 126/574 |
| 2011/0000538 A1* | 1/2011 | Rush | 136/256 |

OTHER PUBLICATIONS

U.S. Appl. No. 12/650,187, filed Dec. 30, 2009; Zheng Jason Geng; office action issued Mar. 22, 2011.

(Continued)

*Primary Examiner* — Alicia M Harrington
(74) *Attorney, Agent, or Firm* — Thorpe North & Western LLP

(57) ABSTRACT

A high concentration photovoltaic (HCPV) optics are described. In one example, an HCPV device can include a frame and a solar sensor cell attached to the frame. The solar cell can be configured to receive an optical beam and can further be configured to convert solar energy in the incident optical beam into electrical energy or power. The HCPV device can further include a non-imaging freeform optical device. The optical device can have an asymmetric surface profile with a predefined surface normal arranged to direct incident optical beams toward an entire solar sensor cell surface area. The freeform optical device can have a larger diameter than the solar sensor cell. Also, the freeform optical device can have an asymmetric surface profile shaped to concentrate the incident optical beams onto the solar sensor cell.

11 Claims, 11 Drawing Sheets

(56) References Cited

OTHER PUBLICATIONS

U.S. Appl. No. 12/703,645, filed Feb. 10, 2010; Zheng Jason Geng; office action issued May 2, 2012.
U.S. Appl. No. 12/703,645, filed Feb. 10, 2010; Zheng Jason Geng; notice of allowance dated Nov. 5, 2012.
U.S. Appl. No. 12/830,930, filed Jul. 6, 2012; Zheng Jason Geng; office action dated Nov. 8, 2012.
U.S. Appl. No. 12/830,930, filed Jul. 6, 2010; Zheng Jason Geng; office action dated Mar. 19, 2013.

* cited by examiner

NON-IMAGING FREEFORM OPTICAL DEVICE FOR USE IN A HIGH CONCENTRATION PHOTOVOLTAIC DEVICE

PRIORITY CLAIM

This application claims the benefit of U.S. Provisional patent application Ser. No. 61/237,732 filed on Aug. 28, 2009 which is incorporated herein by reference. Furthermore, Applicant's copending U.S. patent application Ser. Nos. 12/650,187, filed Dec. 30, 2009, 12/703,645 filed Feb. 10, 2010, and 12/830,930, filed Jul. 6, 2010 are incorporated herein by reference.

BACKGROUND

Solar energy is an abundant, renewable, sustainable, clean, and ecologically rational energy source. For example, one hour of solar energy hitting the Earth can be sufficient to meet the current world demand for approximately one year. The sun could potentially provide a perpetual energy supply. Many technologies have been developed which attempt to harvest solar energy in a cost-effective way and at large scales of economy. Despite advances in solar energy technologies, there are still difficulties in cost-effectively and reliably capturing the solar energy from the sun.

The confluence of recent advances in PhotoVoltaic (PV) cell technologies and advanced optical designs has resulted in increased capabilities for efficient and affordable solar electricity generation at high concentrations. Commercial multi-junction PV cells have demonstrated efficiencies as much as 40% and greater. This high efficiency is typically realized at high flux levels such as may be equivalent to hundreds or even thousands of suns. At such a high concentration, the cost of PV cells can be sufficiently low for various applications despite being more expensive than traditional PV or thin-film cells with a same size of area.

High concentration photovoltaic (HCPV) technologies are often considered to be an efficient approach to convert solar energy directly to electric power. However, costs of producing high concentration PV modules are somewhat high, which may be due at least in part to ineffective optical designs that impose a stringent optical alignment tolerance for system components. The ineffective optical designs can lead to high costs for manufacturing, assembly, transport, installation and maintenance. Providing a practical and affordable solar energy system can come closer to reality with an improvement in optical design techniques.

SUMMARY

The present invention provides high concentration photovoltaic (HCPV) devices, specific embodiments of which are described in accordance with particular examples. In one aspect, the HCPV can include a frame and a solar sensor cell attached to the frame. The solar cell can be configured to receive an optical beam and can further be configured to convert solar energy in the incident optical beam into electrical energy or power. The HCPV device can further include a non-imaging freeform optical device. The optical device can have an asymmetric surface profile with a predefined surface normal arranged to direct incident optical beams toward an entire solar sensor cell surface area. In some aspects, the freeform optical device can have a larger diameter than the solar sensor cell. Also, the freeform optical device can have an asymmetric surface profile shaped to concentrate the incident optical beams onto the solar sensor cell.

In addition, the present invention encompasses methods for forming non-imaging freeform optical devices for use in high concentration photovoltaic devices In one aspect, such a method can include calculating surface normals for multiple locations on a surface of the non-imaging freeform optical device. The calculated surface normal can be calculated based on a half angular field of view of the sun as well as a predetermined distance from the non-imaging freeform optical device to a solar sensor cell. A mold for a substrate of the non-imaging freeform optical device can be shaped such that a surface geometry of the mold is formed according to the surface normals calculated for the non-imaging freeform optical device. The mold can be filled with a substrate material to form a substrate in the shape of the mold. The mold and the substrate can be separated after the substrate material has conformed to the shape of the mold, and the substrate can be polished.

Methods for designing non-imaging freeform optical devices for use in a high concentration photovoltaic device are also encompassed by the present invention. Accordingly in one embodiment, such a method can include identifying a concentration region relative the non-imaging freeform optical device for concentrating incident light from the non-imaging freeform optical device. A first ray can be initiated from a first edge of the concentration region toward a predetermined point on the non-imaging freeform optical device using a ray-tracing model. The first ray can then be redirected toward a first wavefront. A second ray can be initiated from a second wavefront such that the second ray that impinges on the predetermined point and is offset from an angular impingement of the first wavefront at the predetermined point by an angular view of a sun. The second ray can be redirected from the non-imaging freeform optical device to a second edge of the non-imaging freeform optical device. A surface normal can then be calculated for the predetermined point on the non-imaging freeform optical device such that the first and second wavefronts are redirected to the concentration region from a surface of the non-imaging freeform optical device.

DETAILED DESCRIPTION

Figure 1A:
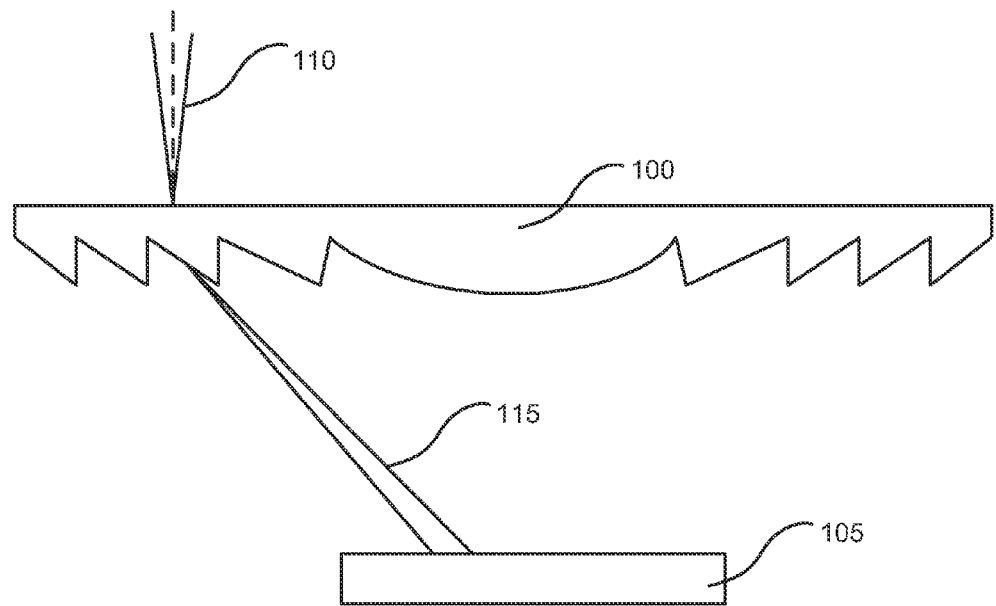
FIGS. 1A-1B illustrate a comparison of optical tolerance in an HCPV system using conventional optical devices and a freeform optical design in accordance with an example.

Reference will now be made to the examples illustrated, and specific language will be used herein to describe the same. It will nevertheless be understood that no limitation of the scope of the technology is thereby intended. Additional features and advantages of the technology will be apparent from the detailed description which follows, taken in conjunction with the accompanying drawings, which together illustrate, by way of example, features of the technology.

In describing and claiming the present technology, the following terminology will be used in accordance with the definitions set forth below.

As used herein, the term "substantially" refers to the complete or nearly complete extent or degree of an action, characteristic, property, state, structure, item, or result. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect on the property of interest thereof.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Systems and methods for forming, designing, or using freeform optical devices in high concentration photovoltaic (HCPV) applications are described. The optical devices, as well as systems and methods including the optical devices or methods for designing or forming the same, can be used in a wide variety of applications. However, the primary focus of the description herein is directed toward photovoltaic devices, such as may be used to harness electrical power from the sun's energy. The principles described herein with respect to photovoltaic devices can also be applied to other optical devices or systems, such as lenses and the like as will be understood by one having skill in the art.

In one example, a HCPV device is provided which includes a frame and a solar sensor cell attached to the frame. The solar cell can be configured to receive an optical beam and can further be configured to convert solar energy in the incident optical beam into electrical energy or power. The HCPV device can further include a non-imaging freeform optical device. The optical device can have an asymmetric surface profile with a predefined surface normal arranged to direct incident optical beams toward an entire solar sensor cell surface area. The freeform optical device can have a larger diameter than the solar sensor cell. Also, the freeform optical device can have an asymmetric surface profile shaped to concentrate the incident optical beams onto the solar sensor cell.

A great degree of cost savings can be achieved by applying advanced optical design techniques to HCPV device designs. The freeform optical design techniques described herein can enable production of compact and low-cost optics for high concentration photovoltaic solar energy modules. The freeform optical designs can provide an increase optical efficiency and concentration ratio over conventional designs while relaxing optical tolerance issues. As a result, manufacturing, assembly, alignment, installation, and maintenance costs can be reduced. The cost reduction can further the use of HCPV technologies in various distributed applications.

The freeform optical devices and designs disclosed herein can be versatile and can be used in both imaging and non-imaging optics applications. Imaging optics can concentrate sunlight to, at most, a similar flux level to that found at the surface of the sun. Non-imaging optics have been used to concentrate sunlight to as much as 84,000 times the ambient intensity of sunlight, exceeding the flux found at the surface of the sun, and approaching the theoretical (2nd law of thermodynamics) limit of heating objects up to the temperature of the surface of the sun. The concept of non-imaging optics design is to relax the constraints of point-to-point mapping (imposed by traditional image formation optics) in order for the optical system to collect as much light as possible. Quality of image formation and minimizing aberration are not the primary goals of non-imaging optics designs. In fact, non-imaging systems do not necessarily create an image of the light source in the focal plane with photographic accuracy. Rather, the design goal of non-imaging optics is to have an optical system that achieve or closely approaching the maximum geometric concentration permitted by physical conservation laws for a given angular field of view. The resulting pattern is usually a scrambled yet more evenly distributed flux.

Among existing solar photovoltaic (PV) technologies, concentrator cells have been reaching increasingly higher efficiencies, generating new interest in high-efficiency, high-concentration solar energy approaches. Multi-junction concentrator cells typically can achieve higher efficiencies than other types of PV cells. Photovoltaic cells can be very expensive. For example, some cells may cost as much as $100,000/m$^2$-$200,000/m$^2$. The cost of silicon solar cells often comprises more than one-half of the cost of a solar energy device. High concentration PV technology uses concentrating optics to focus sunlight onto a small PV cell. As a result, a smaller cell area can be used to produce a same amount of electrical energy as large un-concentrated cell area. For example, crystalline Si cells (having 24.7% efficiency) with a total cell area equal to an Olympic-size swimming pool (50 m×25 m=1250 m$^2$) can generate approximately 422 kW solar energy (1366W/m$^2$*1250 m$^2$*24.7%). With a 500 concentration ratio and 40.7% cell efficiency, a high concentration PV system can use a cell having an approximately 1.5 m$^2$ cell area to generate a same amount of energy (422 kW/(1366W/m$^2$*500*40.7%)). A high concentration PV can potentially result in an 833-fold (1250/1.5) area reduction of PV cells. An overall cost of a PV module typically consists of the following items:

$$C_{overall} = C_{PV\_Cell} + C_{Optics} + C_{Tracker} + C_{balance\_of\_system}$$

The high concentration PV approach is generally attractive overall system costs are reduced as compared to un-concentrated PV approaches (e.g., flat panel crystalline Si cells, and the like). A high concentration PV strategy can be based on various assumptions. For example, some assumptions may include:

(a) Direct radiation: only direct radiation (not scattering sun light) contributes to high concentration PV modules. As a result, an active tracking system may be used to keep the PV module facing the sun.

(b) High concentration rate: the ratio N can be sufficiently high to make the HCPV approach cost-effective. A typical cost-effective ratio N may provide a concentration greater than 500 suns (where one "sun" refers to maximum clear-sky solar normal beam radiation, or approximately 1 mW/mm$^2$).

(c) Glass/aluminum is cheaper than PV: a cost-effective solution includes optics and tracking components used for focusing the sun light which are less expensive than PV materials in the same size.

(d) High Efficiency: for cost-effectiveness, a high concentration PV module, may have a total efficiency (i.e., (optical efficiency)*(cell efficiency)) higher than that of a flat panel un-concentrated crystalline Si cell.

Figure 1B:
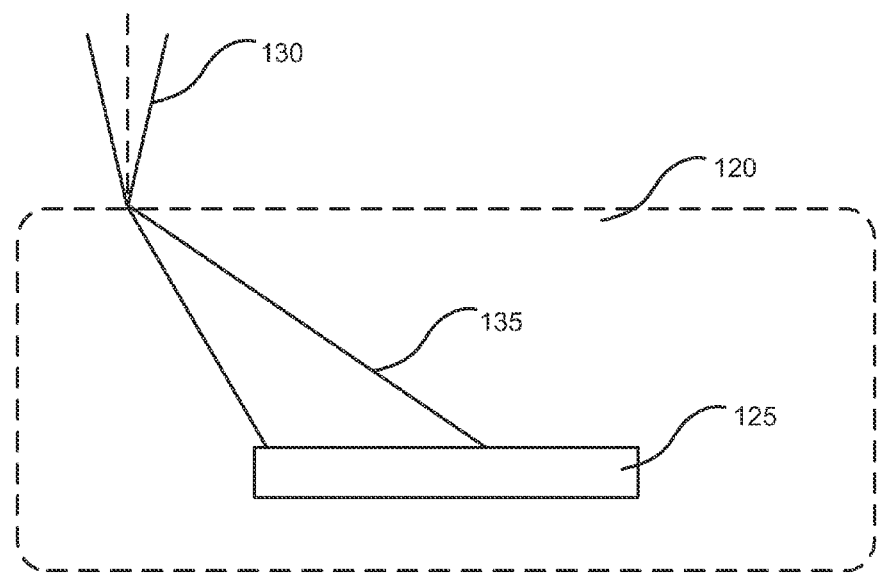

Advanced optical designs are capable of reducing costs for high concentration PV systems in various aspects. For example, advanced optical designs can increase an optical efficiency, provide higher concentration ratios, and relax optical tolerance limitations. Referring to FIG. 1A an example conventional optical device 100 used in HCPV applications is shown redirecting and concentrating sunlight towards a solar cell 105. Incident sunlight 110 is redirected and focused as a redirected beam 115 toward the solar cell. As a comparison, a freeform optical device 120 is shown in FIG. 1B, where a wider angle of incident light 130 is redirected toward a solar cell 125. The wider angle of accepted incident light means that more sunlight can be concentrated to the solar cell than with a conventional optical device. Also, the redirected light 135 can be spread over a greater area of the solar cell to further improve system efficiencies. More specific details of the freeform optical device are described below. The dotted area 120 representing the freeform optical device in FIG. 1B is illustrative only and is not necessarily a representation of an optical device shape used in an actual implementation. For example, the dotted area 120 can represent the freeform optical device, a frame for the freeform optical device, or a combination of both. The frame can also support the solar cell. Various components of FIGS. 1A-1B, as well as the other figures, are illustrative only and do not necessarily represent an actual size, scale, or other specific information, other than what is described herein with regards to the respective figure(s).

Traditional optical designs typically restrict optical elements to have only linearly or rotationally symmetric surface shapes (i.e., spherical surfaces). Due to this restriction, various imaging and non-imaging functions are not or cannot be implemented. For example, in a high concentration PV module design, one design consideration is to have a homogenized irradiance on the cell surface area, independent of the sun's position. A traditional rotationally symmetric optical system may produce a high amount of irradiance on the cell, but the irradiance is may be concentrated on a small spot with an extremely high peak (e.g., >10,000 sun intensity). Such a design can be impractical. For example, the high peak can degrade the cell efficiency due to grid series resistance and tunnel diodes in multi-junction cells. The high peak intensity may even damage the cell structure, creating potential reliability and maintenance issues.

In contrast, the freeform optical device described herein extends the range of surface shapes for PV optical applications from rotationally symmetric to arbitrary and/or non-rotationally symmetric shapes (i.e., freeform surfaces). As a result, PV and optical systems can implement arbitrary optical imaging or non-imaging functionality. The freeform optical devices can include lenses, mirrors, or mixed uses of lenses and mirrors. Due to diffraction, use of traditional complex spherical optics often introduces strong optical aberrations. More spherical lenses are often used to correct such aberrations, which in turn introduce additional aberrations. In contrast, mirror-based designs typically do not suffer from such aberrations, which can result in a simpler and more effective system design.

Figure 2A:
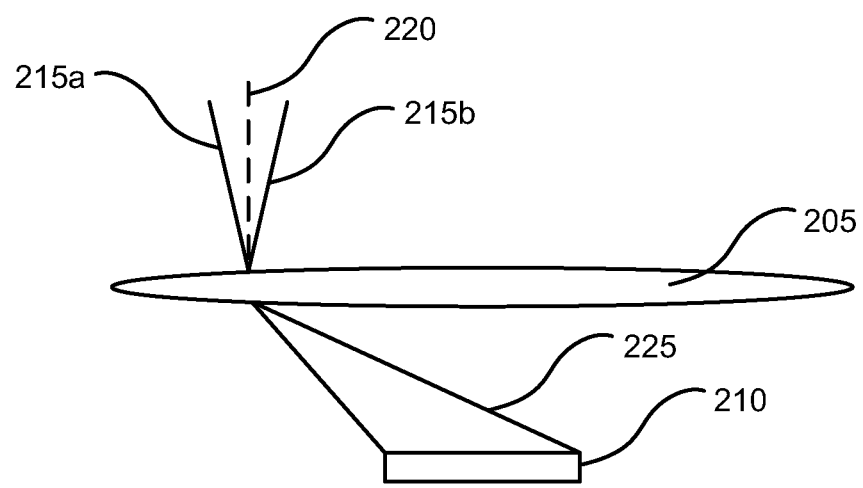
FIGS. 2A-2D are example HCPV system designs including a freeform optical device in accordance with an example.

Referring to FIGS. 2A-2D various exemplary optical configurations for high concentration PV modules using freeform optical devices are shown. Differences among the optical configurations include the uses of refractive vs. reflective surfaces, and in the use of total internal reflection. Some configurations not shown may also include a homogenizer in order to achieve acceptable flux distribution uniformity. FIG. 2A illustrates a configuration including two refractive surfaces on a freeform optical device 205, such as two sides of a lens, through which an incident optical beam 215a, 215b is transmitted and redirected toward a solar cell 210. The redirected beam 225 can be redirected to cover all, or a substantial portion of, a surface of the solar cell. For typical HCPV cells, cell areas are generally quite small (e.g., less than 1 cm$^2$, or less than 1 mm$^2$). Therefore, the freeform collector optics are designed to accommodate such miniature dimensions. For example, a collector optics aperture may have an area of up to 400 cm$^2$.

Each of FIGS. 2A-2D include incident optical beams, and redirected optical beams (e.g., redirected by reflection or refraction). Also, the dotted line 220 shown between incident optical beams 215a and 215b represents a half angle of acceptance, where an angle between incident optical beams 215a and 215b represents a full angle of acceptance. For high efficiency, the angle of acceptance can be an acceptance angle of the sun. In other words, the angle between incident optical beams 215a and 215b can be approximately equal to an angle between an imaginary line drawn from one edge of the sun to a focal point on the optical device and another imaginary line drawn from an opposite edge of the sun to the focal point. The half angle of acceptance 220 can represent a half angle field of view of the sun, or an angle between an imaginary line drawn from one edge of the sun to a focal point on the optical device and another imaginary line drawn from a center of the sun to the focal point.

Figure 2B:
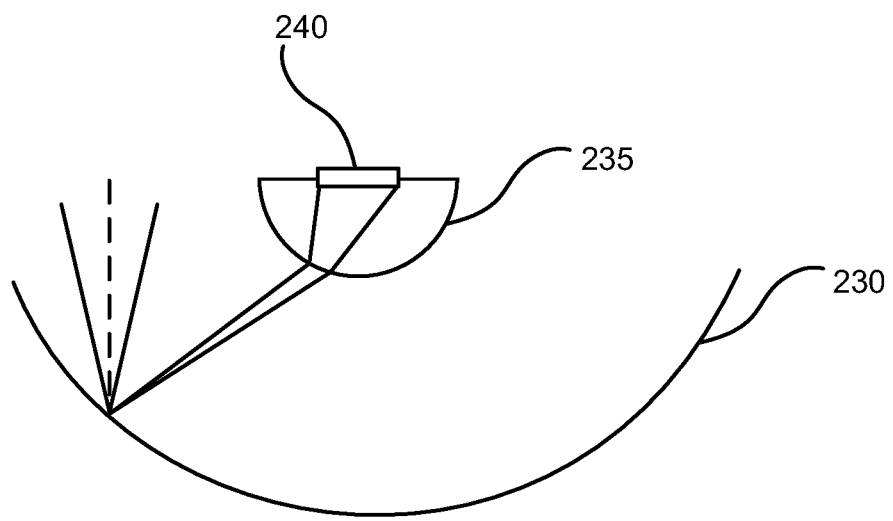
Figure 2C:
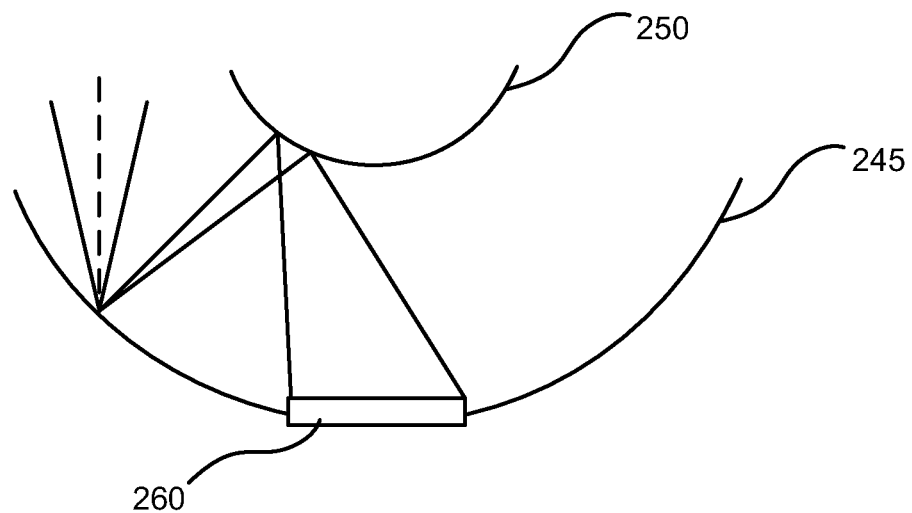
Figure 2D:
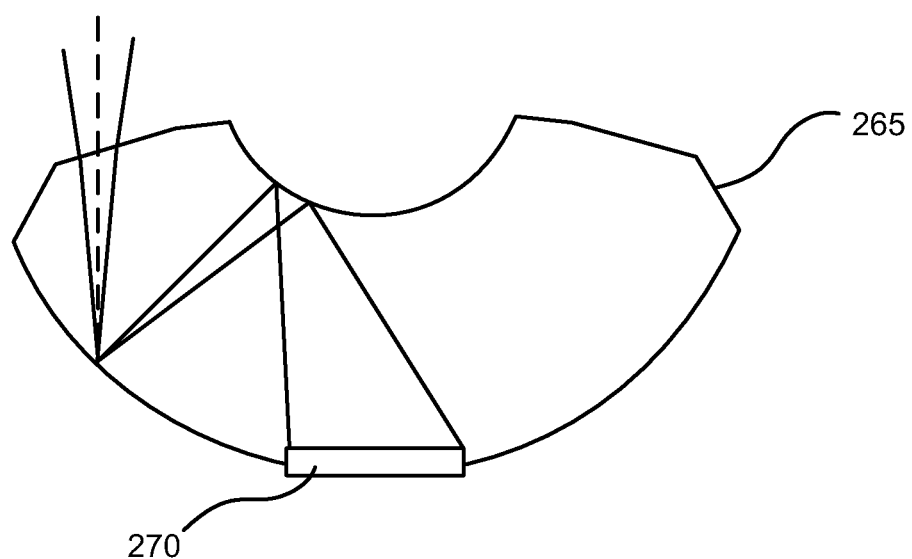

Referring to FIG. 2B, a design configuration is shown which includes a freeform mirror 230 and a freeform lens 235. The incident optical beams 215a, 215b are redirected toward a refractive surface, or a lens 235, where the beams are refracted toward a solar cell 240. FIG. 2C illustrates a design configuration utilizing a plurality of freeform mirrors 245, 250 to reflect the incident optical beams toward a solar cell 260. FIG. 2D illustrates a design configuration utilizing total internal reflection. In this example, a single refractive optical element 265 can refract an incident optical beam upon incidence and redirect the optical beam using total internal reflection toward a solar cell 270.

Though the freeform optical devices shown in FIGS. 2A-2D may generally appear symmetrical, the drawings are illustrative of the functionality only, and not necessarily of an actual freeform shape, which may be asymmetric al.

Figure 3:
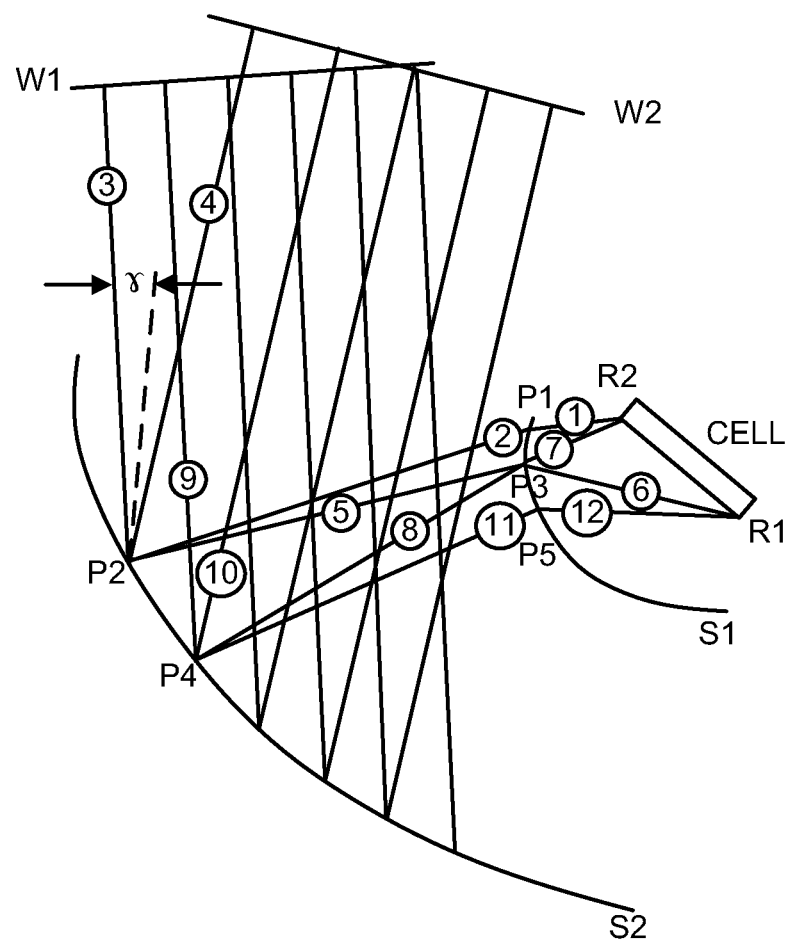
FIG. 3 is a ray-tracing diagram for designing a freeform optical device for use in a HCPV device in accordance with an example.
Figure 4:
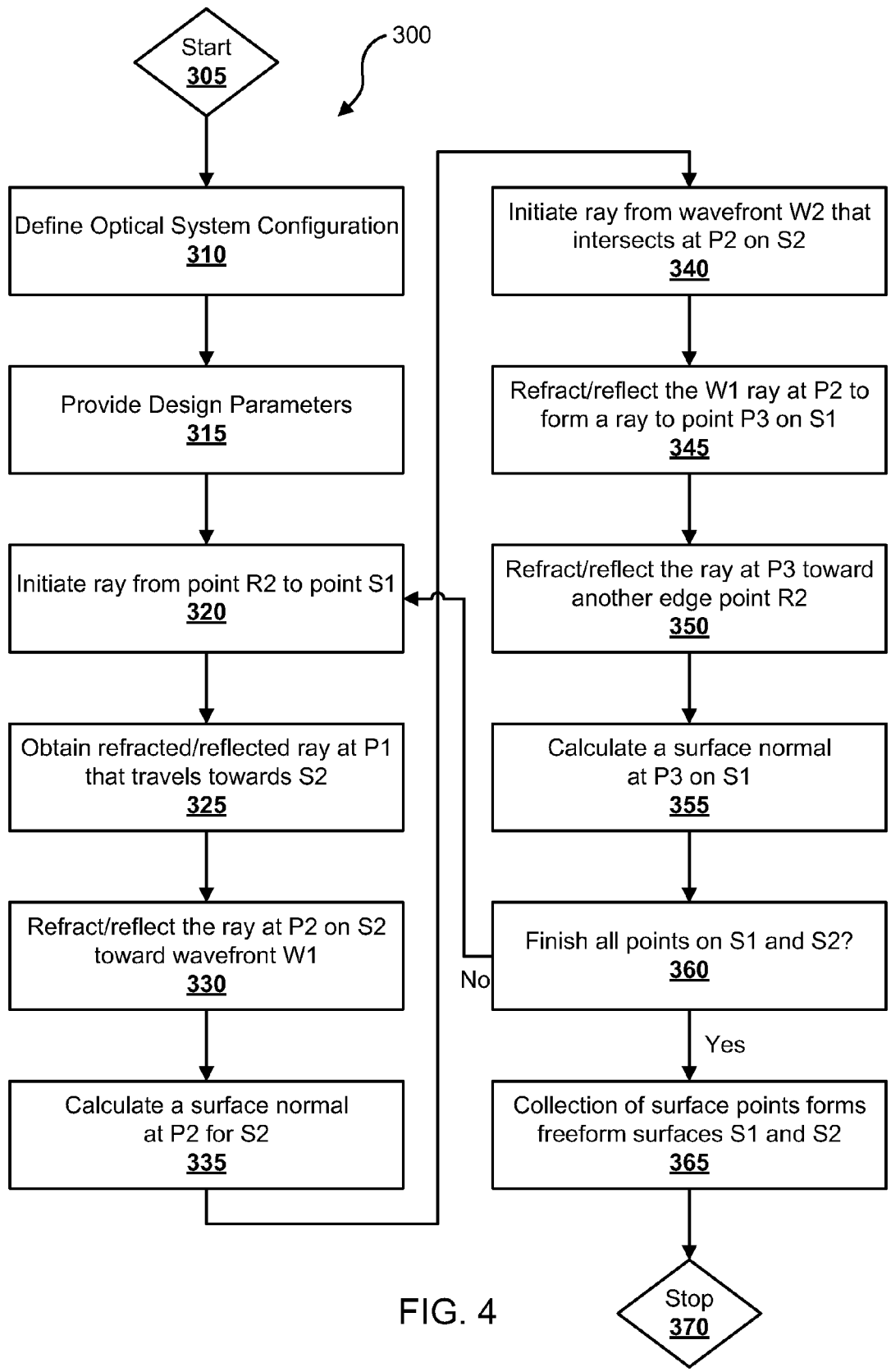
FIG. 4 is a diagram of a design of a surface of a freeform optical device for use in a HCPV device in accordance with an example.

Ray-tracing can be a useful approach in designing a freeform optical device. With reference to FIG. 3, a generic scenario of an HCPV system configuration will be described to illustrate ray-tracing in the design of the freeform optics HCPV module. In this example, an optical configuration similar to that shown in FIG. 2B described above is used. A light source (i.e., the sun) is assumed to be at an infinite distance. Rays from the sun are virtually in parallel and are represented as wavefronts W1, W2. One design parameter used in the ray tracing model is the half acceptance angle of the sun γ. W1 and W2 represent two extreme wavefronts from opposite sides of the sun with an offset angle 2γ between W1 and W2. The two wavefronts serve as edge rays. The rays perpendicular to the wavefront W1 are concentrated on to the edge R2 at the solar cell, and the rays perpendicular to the wavefront W2 are concentrated on to the edge R1.

The ray-tracing process can begin by starting with a known edge point on the cell, R2, and a given point P1 on a refractive freeform optical device surface S1 with a known surface normal. A ray [?] travelling from R2 to P1 will refract at P1 to form ray [?]. A point along this ray can be selected as a surface point P2 of the mirror surface S2. Ray [?] can be reflected by the mirror surface to become ray [?] traveling toward the wavefront W1. Given directions of rays [?] and [?], the surface normal at point P2 can be calculated.

Ray [?] coming from wavefront W2 can be used as an impinging ray at point P2. Ray [?] can be reflected by the mirror surface at P2 to form ray [?], which hits the refractive surface S1 at point P3. Ray [?] refracts at P3 to become ray [?] pointing to edge R1 on the cell.

After obtaining a position and surface normal for P3, ray [?] can be initiated coming from edge R1 to P3. Ray [?] can refract at P3 to become ray [?], which can in turn be reflected at point P4 on the mirror surface to a substantially perpendicular direction of W1 (ray [?]). Based on the known directions of rays [?] and [?], the surface normal at point P4 can be calculated.

Ray [?] coming from wavefront W2 can be used as an impinging ray at point P4. Ray [?] can be reflected by the mirror surface at P4 to form ray [?], which hits the refractive surface S1 at point P5. Ray [?] refracts at P5 to become ray [?] pointing to edge R1 on the cell.

This iterative process can be repeated until all of the surface points on the reflective and refractive surfaces are computed.

Figure 5:
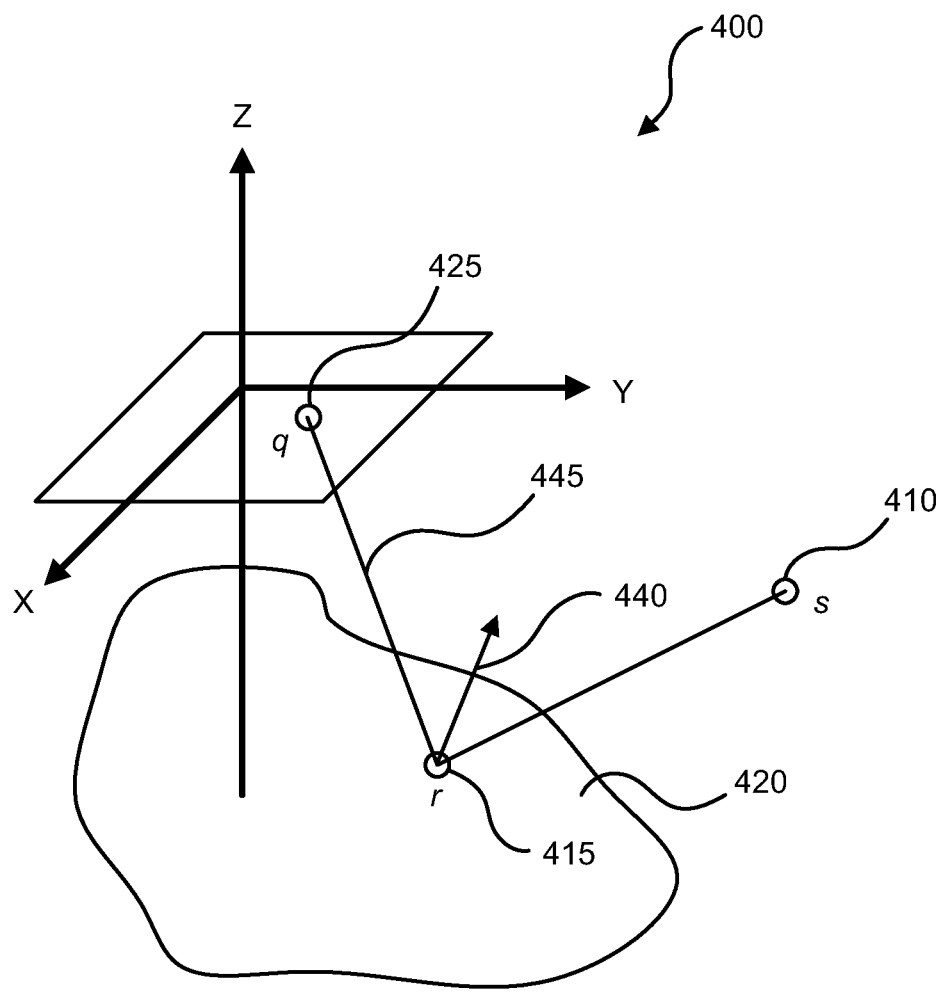
FIG. 5 is a diagram of a design of a freeform optical device for use in a HCPV device in accordance with an example.

FIG. 5 is a flow diagram of a method 300 which summarizes the ray-tracing procedures for the freeform optics design process described above. This iterative design method is generic and can be applicable to various freeform optical configurations (and associated combinations). The method is also flexible with numerous design parameters that can be altered by a designer to optimize specific optical performance aspects.

In FIG. 5, the method starts at step 305. A desired optical system configuration is defined at step 310, such as one of the example configurations shown in FIGS. 2A-2D, or any other desired configuration. At step 315, design parameters are provided, such as cell size, initial surface points, tolerance angle, ratio, and so forth. At step 320, the process starts with one edge point R2 on the solar cell and initiates a ray toward a given point on S1. A refracted or reflected ray can be obtained at P1 that travels towards S2 at step 325. At step 330 the ray can be reflected or refracted at P2 on S2 toward wavefront W1. The surface normal at P2 for S2 is calculated at step 335. At step 340, a ray is initiated from another wavefront W2 that intersects P2 on S2. At step 345, the W1 ray is refracted or reflected at P2 to form a ray pointing to P3 on S1. The ray at P3 is then refracted or reflected toward another edge point R2 on the cell at step 350. At step 355, the surface normal at P3 on S1 is calculated. At step 360, the method queries whether all points on S1 and S2 have been finished (i.e., surface normals for all points on S1 and S2 have been calculated). If no, the method returns to step 320. If yes, the method proceeds to step 365 where a freeform surface is defined for S1 and S2 from a collection of all the surface points and calculated surface normal. The method ends at step 370.

After an initial design is finished, design optimization procedures can be applied to further improve system performance. For example, some variables that may be optimized include total flux, angular distribution of optical radiation, and spatial distribution of optical radiation. These variables on the cell can be optimized while simultaneously considering the collection efficiency of the optical system.

While in the above examples a generic scenario was used to illustrate the ray-tracing process, the general design method can be applied to various specific problems in designing a high concentration PV module using the freeform optics devices, designs and techniques. For example, the design method can be used with other methods, procedures, software modules, toolboxes, user interfaces, systems, and so forth.

A mirror or lens can perform a "scene-to-image" (S2I) mapping function. In other words, points of a scene, such as rays from the sun, can be mapped onto specific locations of a mirror or lens surface. For example, referring to FIG. 5, a S2I mapping relationship M for a mirror can be used to map any point s 410 in a scene onto a corresponding point q 425 on a solar cell via a reflecting point r 415 on a mirror R 420. As shown in the figure, the optical ray originating from scene point s can strike the mirror surface at point r and be then reflected by the mirror according to the law of reflection (e.g., the angle of incidence is equal to the angle of reflection). The optical ray can intersect the image plane (i.e., the surface of the solar cell) at corresponding point q. A similar process can be used for lenses as with mirrors. Though the plane is referred to as an imaging plane, this does not mean that an image is formed, as with other conventional optical devices. For example, the optical device can be a non-imaging device which can scatter or distort light from a source arbitrarily to the imaging plane without forming an image of the optical beam source.

One problem encountered with freeform optical device designs is finding a mirror profile R from a desired scene-to-image (S2I) mapping relationship. In the above example, the scene-to-image mapping relationship can be a map of optical beams within an acceptance angle of the sun onto a plane of the solar cell according to an arbitrarily prescribed order.

However, according to systems and methods herein, such design problems can be resolved. Constraints imposed by the S2I mapping relationship can be used to derive partial differential equations (PDEs) that can be used to form a desired mirror surface. Analytical solutions for the PDEs can also be used to determine the mirror shape. In general, however, a theoretical close-form solution with arbitrarily defined mapping relationships can be difficult. Even though a solution may exist for some simple cases, the approach of deriving and solving PDEs for each S2I map can be cumbersome and difficult to scale.

To address previous design problems, a method for designing freeform optical devices for photovoltaic applications is provided which can produce a surface geometry to achieve a given arbitrary and desired S2I mapping relationship.

Figure 6:
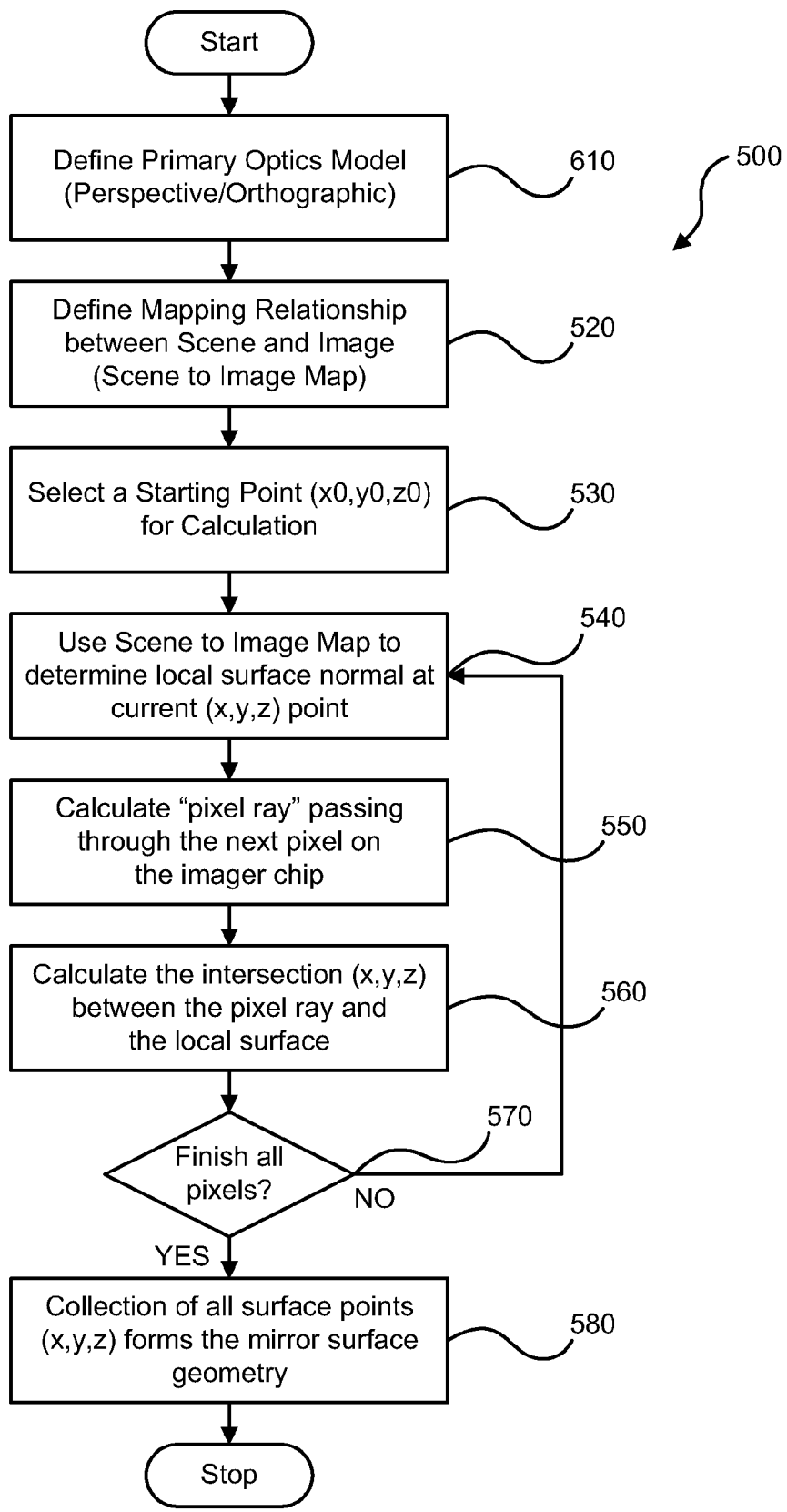
FIG. 6 is a flow diagram of a process for designing a surface contour of a freeform optical device for use in a HCPV device in accordance with an example.

FIG. 6 shows a flowchart of a wide FOV optics design method 500. The method begins with defining 510 a primary optics model (such as perspective or orthographic, for example). A mapping relationship can be defined 520 between a scene and an image (S2I map). The method can continue by selecting 530 a starting point (x0,y0,z0) on a mirror surface. This point can usually be determined by system design parameters, such as stand-off distance, mirror size, etc. Starting from this point, the mirror shape can be determined and/or defined by finding surface normals at any and all points on the mirror surface for the desired mapping relationship. The surface normal at a surface point can be calculated 540 based on the pre-defined imager-to-scene mapping and the reflection law of optics (impinging angle equals to reflecting angle). Using symbols defined above in FIG. 5, the normal vector 440 is given by:

$$N(r) = \|q - r\| + \|s - r\| = \frac{q-r}{|q-r|} + \frac{s-r}{|s-r|} = [n_x, n_y, n_z]^T$$

where point q on the image plane corresponds to point s in the scene via reflecting point r on mirror surface. $n_x$, $n_y$, and $n_y$ are the components of the normal vector. T is the transpose of a vector which changes a column vector to a row vector, or vice versa.

The location of the current surface point r(x0,y0,z0) and the local surface normal N(x0,y0,z0) can determine a local surface. The method can propagate from a current surface point to a next point by solving the intersection point of the current surface with the pixel ray 445. To obtain the next point, r(x,y,z), the method can include calculation 550 of the ray based on projection geometry and location on the viewer's eye as follows:

$$Q(r) = \frac{[Q_x, Q_y, Q_z - f]^T}{\|[Q_x, Q_y, Q_z - f]^T\|} = [q_x, q_y, q_z]^T$$

The intersection point between the ray Q and the local surface becomes the next point r(x,y,z).

The method can then further include solving a liner equation to find 560 the coordinate of next point r:

$$Ar=B, \text{ where}$$

$$A = \begin{vmatrix} n_x & n_y & n_z \\ \frac{1}{q_x} & \frac{1}{q_y} & 0 \\ 0 & \frac{1}{q_y} & \frac{1}{q_z} \end{vmatrix}, \quad B = \begin{bmatrix} n_x R_x + n_y R_y + n_z R_z \\ \frac{Q_x}{q_x} - \frac{Q_y}{q_y} \\ \frac{Q_y}{q_y} - \frac{Q_z}{q_z} \end{bmatrix}$$

The design methods can use the same routing to calculate 570 all of the points on the mirror surface to define 580 an accurate surface geometry that implements the prescribed S2I mapping. The resulting surface profile can be non-symmetrical and aspherical and provide superior optical performance to prior devices.

Figure 7:
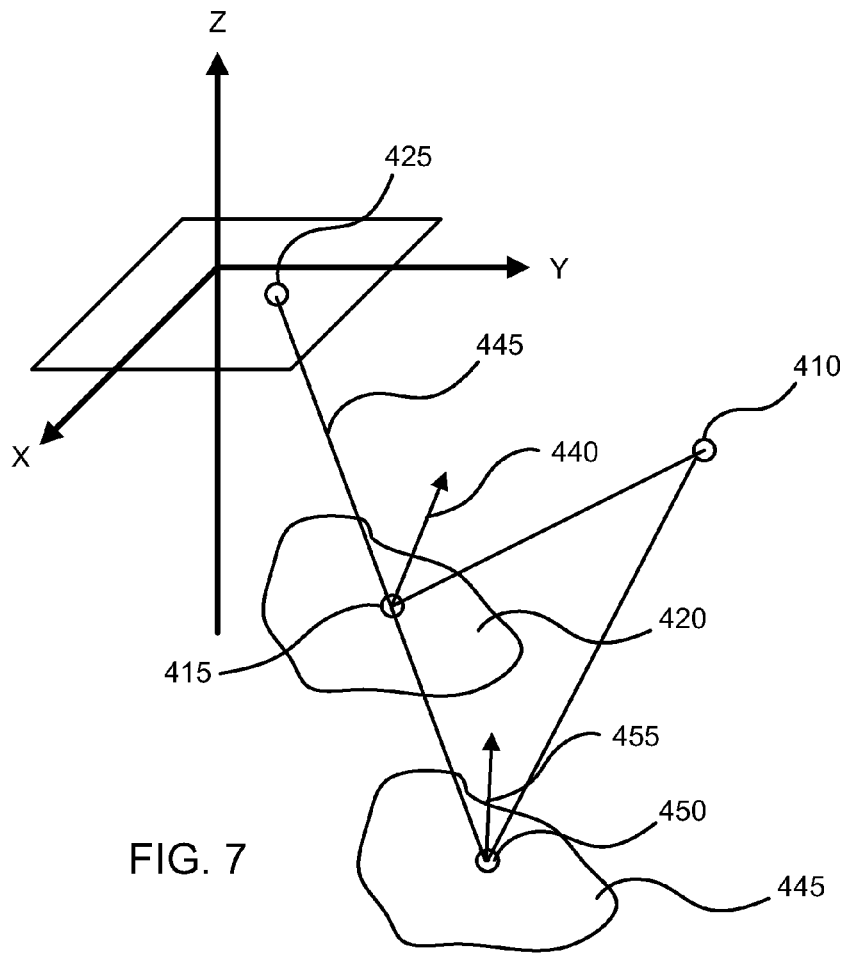
FIG. 7 is a diagram of a design of a surface of a freeform optical device for use in a HCPV device in accordance with an example.
Figure 8A:
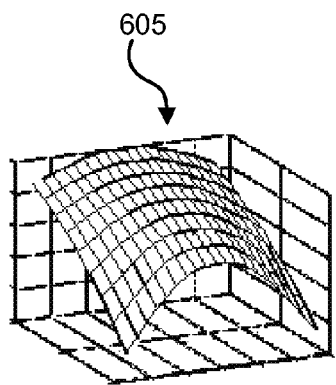
FIGS. 8A-8B are graphical representations of a surface contour of an optical device designed according to an example.
Figure 8B:
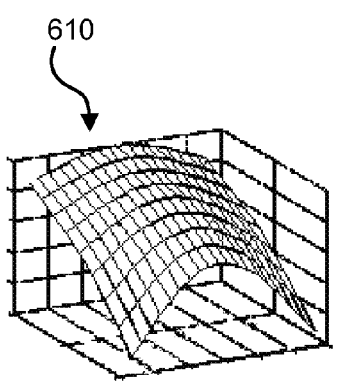
Figure 8C:
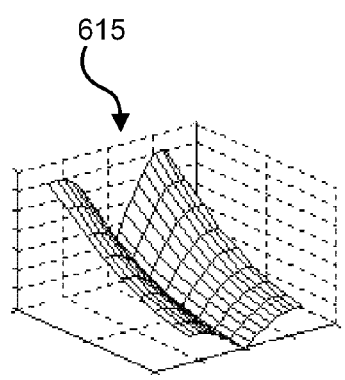
FIG. 8C illustrates a minimized distortion of the surface contour of FIG. 8A when refined to the surface contour of FIG. 8B.

In some examples, the mirror can be designed by performing a single pass of the method to calculate the various points of the mirror surface. However, in some examples, an iterative optimization method can be used to further improve the design. Use of aspherical and non-symmetrical optical components can enable design freedom for optimizing design parameters of each component to achieve a desired overall system performance. For example, given a Scene-to-Image (S2I) map, there may be an infinite number of choices for mirror location in three dimensional space. FIG. 7 shows an example where two mirrors 420, 445 at different locations are used to implement a same S2I map. In other words, each mirror has a reflecting point 415, 450 respectively to reflect a point in a scene 410 at point 425 or through the plane 430 of point 425. Each mirror may have a different surface normal to implement the same S2I map. By applying iterative optimization methods, overall design accuracy and quality can be improved. FIGS. 8A-8B show an example of the iterative optimization process. The original mirror surface design 605 (after the first run) is shown. An optimized surface shape 610 after 10 iterations is also shown. FIG. 8C shows a plot 615 of the error surface between the first and second designs 605, 610. The error is approximately 9% of the surface profile magnitude. The error calculation demonstrates the effectiveness of an iterative optimization method in improving mirror surface design.

Figure 9:
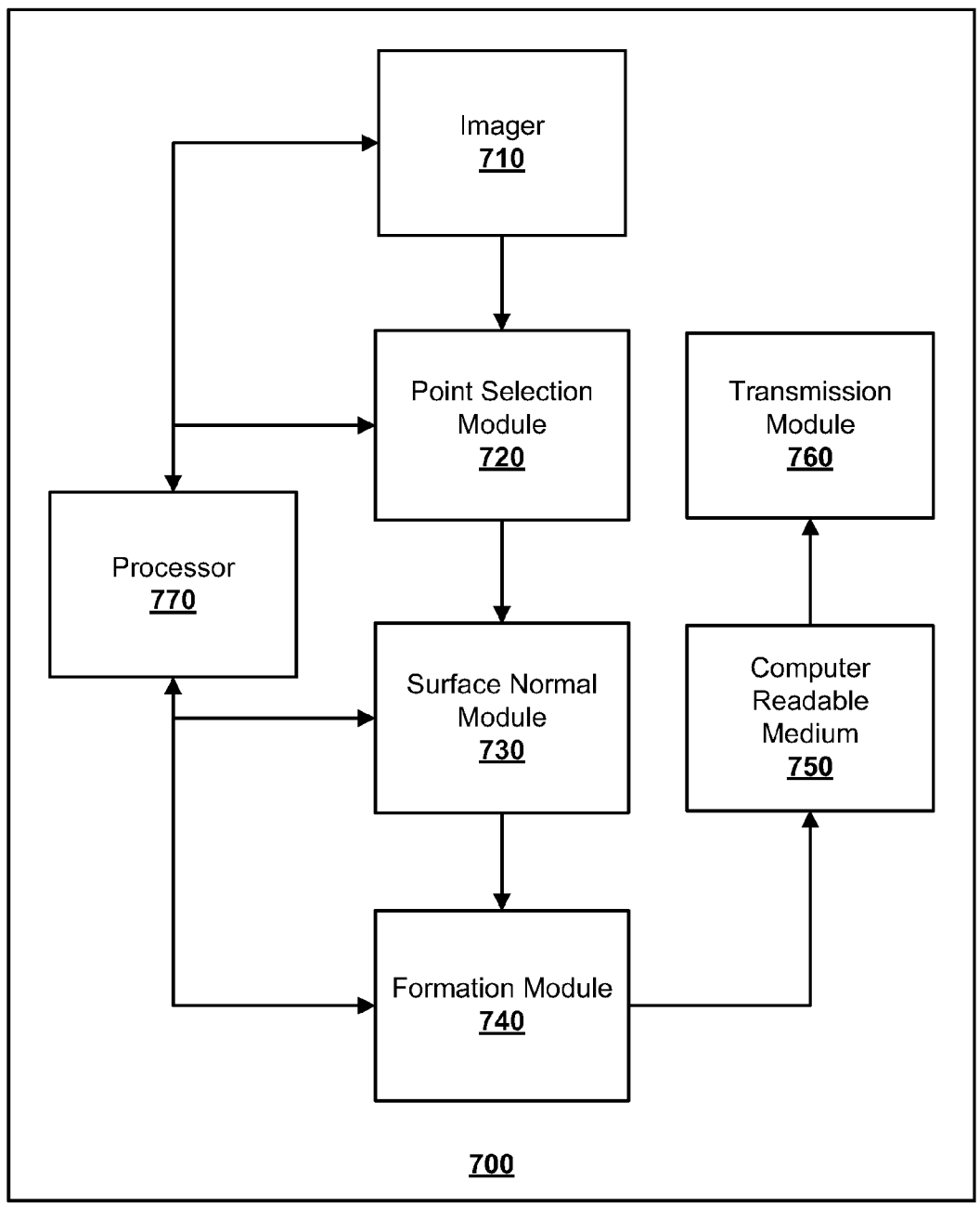
FIG. 9 is a block diagram of a system for designing a freeform optical device for use in a HCPV device in accordance with an example.

Referring to FIG. 9, a system 700 is shown for designing a wide field of view optical device in accordance with an example of the present technology. The system includes an imager 710. The imager can provide simulated locations of the optical device, as well as a view, and a focal point of the view from the optical device. A point selection module 720 can be used to determine a first point on a surface of the optical device and to calculate a next point on the surface. A surface normal module 730 can be used to determine surface normals for the surface of the optical device at the first point and the next point. A formation module 740 can also be included in the system to form a surface geometry of the optical device from the determined surface normals. The system can include a computer readable medium 750 configured to store the surface geometry. The system can also include a transmission module configured to transmit the surface geometry from the formation module 760 to a machining device. The system can include a machining device configured to machine or form the surface geometry on a substrate. For example, the machining device can include a lathe, a mold, or any other suitable device for machining or shaping the substrate to match the surface geometry. In one aspect, the system can include a processor 770 in communication with the imager, point selection module, surface normal module, and formation module and configured to process data from the imager, point selection module, surface normal module, and formation module.

The final shape of the mirror surface can be designed using a computer and/or processor or other type of system, such as the system described above. In one aspect, ray tracing can be used to determine surface normals to direct incident light rays toward the desired solar cell location. Once the final shape of the mirror surface is determined, the mirror can be fabricated. In one example, a mirror can be fabricated using an anodized aluminum alloy substrate material. A six axis machining center can be used to mill out the precision shape of the freeform mirror surface. The surface can be polished to become reflective. In one aspect, the fabricated mirror can be a test mirror to test reflectiveness, distortion, etc. of the shape. The substrate material or the design as stored on a computer readable medium can be used to make a metal mold to produce the freeform mirror. The mold can be used with glass or plastic substrate materials, or other suitable materials, to form a mirror out of the selected material and in the shape of the mold.

Figure 10:
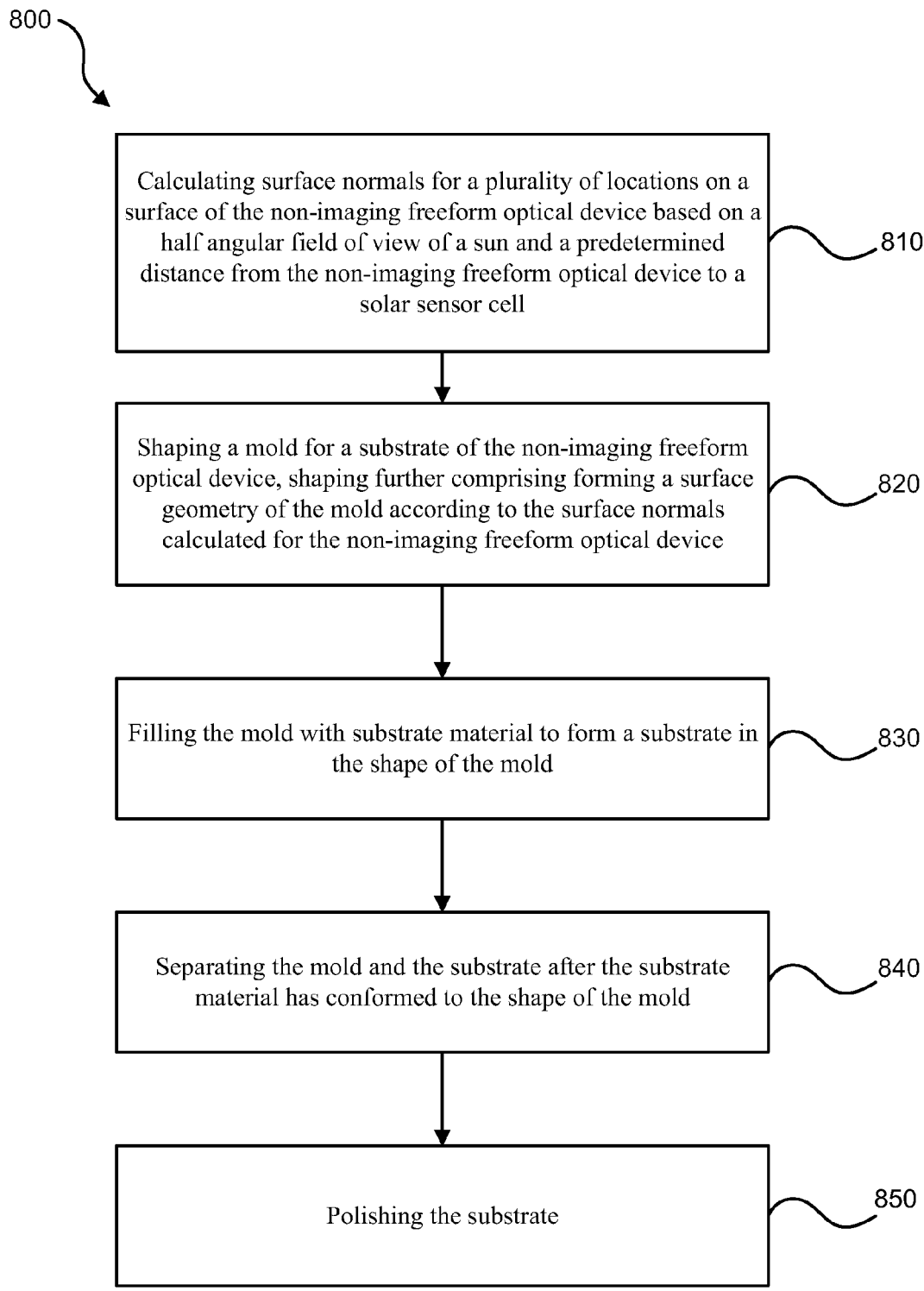
FIG. 10 is a flow diagram of a method for creating a freeform optical device for use in a HCPV device in accordance with an example.

A method 800 for forming a non-imaging freeform optical device for use in a high concentration photovoltaic device is shown in FIG. 10. The method includes calculating 810 surface normals for a plurality of locations on a surface of the non-imaging freeform optical device based on a half angular field of view of a sun and a predetermined distance from the non-imaging freeform optical device to a solar sensor cell. A mold for a substrate of the non-imaging freeform optical device can be shaped 820, where shaping further comprises forming a surface geometry of the mold according to the surface normals calculated for the non-imaging freeform optical device. The mold can be filled 830 with substrate material to form a substrate in the shape of the mold. The mold and the substrate can be separated 840 after the substrate material has conformed to the shape of the mold. The substrate can then be polished 850.

In a further aspect of the method, calculating surface normals for the plurality of locations on the surface of the non-imaging freeform optical device comprises calculating surface normals based on reflectance from the non-imaging freeform optical device to the solar sensor cell. In another aspect, calculating surface normals for the plurality of locations on the surface of the non-imaging freeform optical device comprises calculating surface normals based on refraction from the non-imaging freeform optical device to the solar sensor cell.

At least one side of the substrate can be coated with one or more reflective materials to form the optical device into a mirror instead of just a lens. Mirror making is well-known and various mirror making techniques as are known in the art are contemplated. The following description of formation of the mirror is for example and is not a limitation of the techniques by which mirror in accordance with the examples herein may be manufactured. Mirrors can typically be manufactured by applying a reflective coating to a suitable substrate. Glass can be a desirable substrate due to transparency, ease of fabrication, rigidity, and ability to take a smooth finish. Plastic or other materials can also be used. The reflective coating is typically applied to the back surface of the glass to protect the coating from corrosion and accidental damage. After a mirror substrate has been formed in a mold, or after the mirror substrate is shaped, the substrate can be polished and cleaned, and then coated with the reflective coating.

The mirror can be coated with a non-toxic silver or aluminum coating, or other coating. In one aspect, the coating may comprise a series of coatings. In one example, the coating can include a plurality of layers. For example, a first layer may be Tin(II) chloride. Tin(II) chloride can be applied because silver will not bond with the glass. Silver can then be applied. A Chemical activator can then be used to cause the tin and/or the silver to harden. Copper can be added for long term durability and paint can be added to protect the coating(s) on the mirror from scratches or other damage.

In some applications, the mirror can be made from a polished metal as described above. In some applications, the reflective coating can be applied by vacuum deposition on the front surface of the substrate, which can eliminate double reflections (a weak reflection from the surface of the glass, and a stronger one from the reflecting metal) and reduce absorption of light by the mirror. Varying materials can be used in forming the reflective coating to achieve varying degrees of reflectiveness. Protective transparent overcoats can be used to prevent oxidation of the reflective layers. Also, for higher reflectivity or greater durability dielectric coatings can be used to achieve reflectivities as high as 99.999% over a narrow range of wavelengths.

Figure 11:
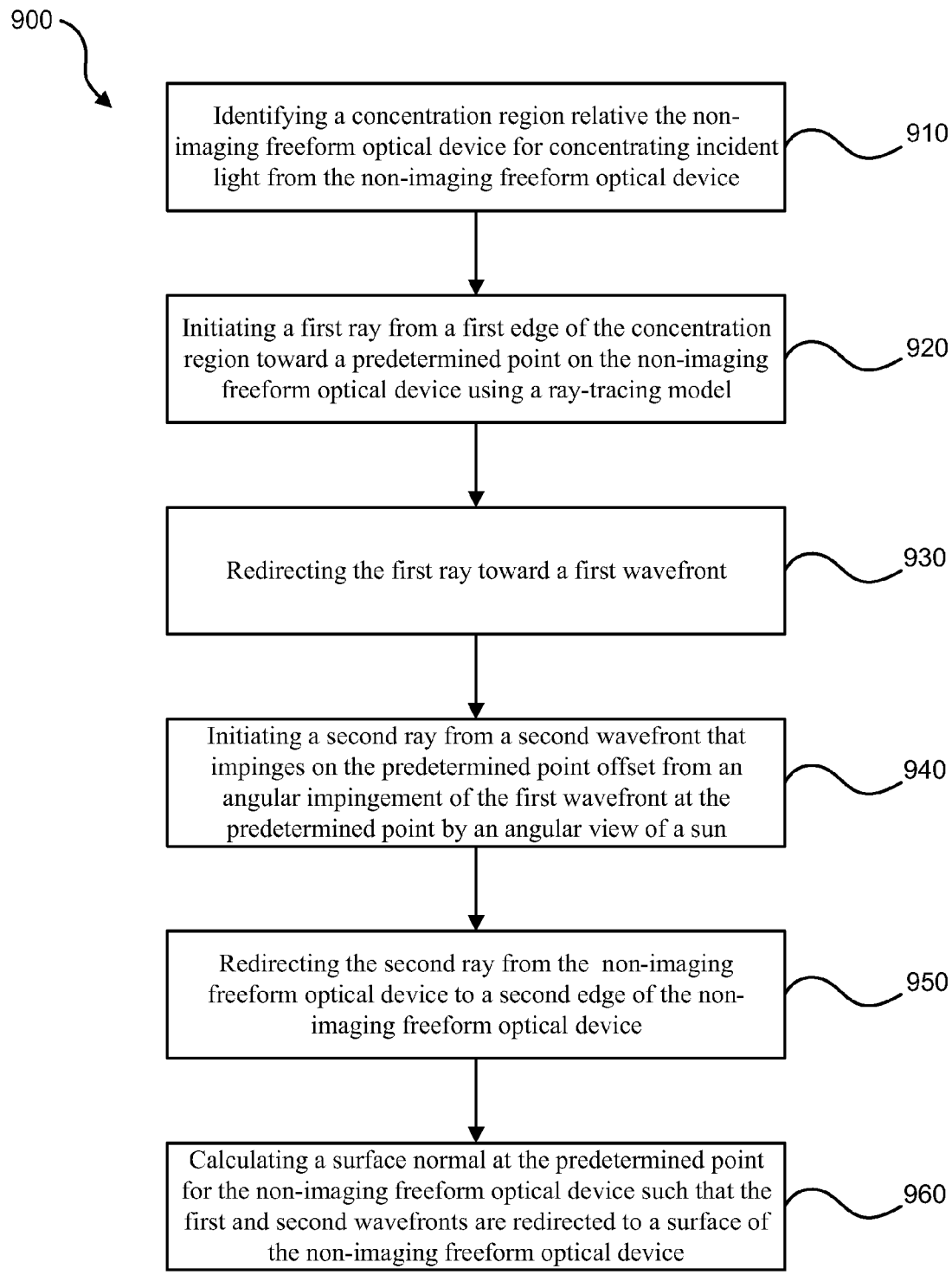
FIG. 11 is a flow diagram of a method for designing a freeform optical device for use in a HCPV device in accordance with an example.

A method 900 for designing a non-imaging freeform optical device for use in a high concentration photovoltaic device in accordance with examples is shown in FIG. 11. The method includes identifying 910 a concentration region relative the non-imaging freeform optical device for concentrating incident light from the non-imaging freeform optical device. A first ray can be initiated 920 from a first edge of the concentration region toward a predetermined point on the non-imaging freeform optical device using a ray-tracing model. The first ray can be redirected 930 toward a first wavefront. A second ray can be initiated 940 from a second wavefront that impinges on the predetermined point offset from an angular impingement of the first wavefront at the predetermined point by an angular view of a sun. The second ray can be redirected 950 from the non-imaging freeform optical device to a second edge of the non-imaging freeform optical device. A surface normal at the predetermined point can be calculated 960 for the non-imaging freeform optical device such that the first and second wavefronts are redirected to a surface of the non-imaging freeform optical device.

In a further aspect, the non-imaging freeform optical device is a second optical device and the method includes redirecting the first ray from a first optical device after initiating the first ray and before redirecting the first ray. In this aspect, the method can further include calculating a surface normal of the first optical device. In another aspect, the non-imaging freeform optical device is a first optical device and the method includes redirecting the second ray from a second optical device after redirecting the second ray and before calculating the surface normal. In this aspect, the method can further include calculating a surface normal of the second optical device. Redirection of the first or second ray can be through reflection or refraction by lenses or mirrors or combinations of lenses and mirrors. The various steps of the method can be repeated to solve surface normals for many points on the surface of the optical device(s).

The freeform optical devices described above can result in higher optical tolerance in photovoltaic applications and reduce overall system costs significantly. For example, high optical tolerance can help relax stringent precision of optical components, lowering costs for fabrication of optics. High optical tolerance can also help relax stringent precision of optical assembly and alignment, thus lowering costs for module assembly, system integration, installation, and maintenance. High optical tolerance can also help relax stringent accuracy and stiffness of tracker and control systems, thus lowering costs for tracker/control system production and maintenance. In addition, advanced optical design techniques can reduce the number of optical elements, allowing each optical surface to perform as many functions as possible, thus further reducing the costs of the systems overall.

The methods and systems of certain examples may be implemented in hardware, software, firmware, or combinations thereof. In one example, the method can be executed by software or firmware that is stored in a memory and that is executed by a suitable instruction execution system. If implemented in hardware, as in an alternative example, the method can be implemented with any suitable technology that is well known in the art.

The various engines, tools, or modules discussed herein may be, for example, software, firmware, commands, data files, programs, code, instructions, or the like, and may also include suitable mechanisms.

Reference throughout this specification to "one example", "an example", or "a specific example" means that a particular feature, structure, or characteristic described in connection with the example is included in at least one example of the present technology. Thus, the appearances of the phrases "in one example", "in an example", or "in a specific example" in various places throughout this specification are not necessarily all referring to the same example. Furthermore, the particular features, structures, or characteristics may be combined in any suitable manner in one or more examples.

Other variations and modifications of the above-described examples and methods are possible in light of the foregoing disclosure. Further, at least some of the components of an example of the technology may be implemented by using a programmed general purpose digital computer, by using application specific integrated circuits, programmable logic devices, or field programmable gate arrays, or by using a network of interconnected components and circuits. Connections may be wired, wireless, and the like.

It will also be appreciated that one or more of the elements depicted in the drawings/figures can also be implemented in a more separated or integrated manner, or even removed or rendered as inoperable in certain cases, as is useful in accordance with a particular application.

Also within the scope of an example is the implementation of a program or code that can be stored in a machine-readable medium to permit a computer to perform any of the methods described above.

Additionally, the signal arrows in the Figures are considered as exemplary and are not limiting, unless otherwise specifically noted. Furthermore, the term "or" as used in this disclosure is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Various functions, names, or other parameters shown in the drawings and discussed in the text have been given particular names for purposes of identification. However, the functions, names, or other parameters are only provided as some possible examples to identify the functions, variables, or other parameters. Other function names, parameter names, etc. may be used to identify the functions, or parameters shown in the drawings and discussed in the text.

Some of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more blocks of computer instructions, which may be organized as an object, procedure, or function. Nevertheless, the executables of an identified module need not be physically located together, but may comprise disparate instructions stored in different locations which comprise the module and achieve the stated purpose for the module when joined logically together.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices. The modules may be passive or active, including agents operable to perform desired functions.

While the forgoing examples are illustrative of the principles of the present technology in one or more particular applications, it will be apparent to those of ordinary skill in the art that numerous modifications in form, usage and details of implementation can be made without the exercise of inventive faculty, and without departing from the principles and concepts of the technology. Accordingly, it is not intended that the technology be limited, except as by the claims set forth below.

What is claimed is:

1. A method for forming a non-imaging freeform optical device for use in a high concentration photovoltaic device, comprising:
    calculating surface normals for a plurality of locations on a surface of the non-imaging freeform optical device based on a half angular field of view of a sun and a predetermined distance from the non-imaging freeform optical device to a solar sensor cell;
    shaping a mold for a substrate of the non-imaging freeform optical device, shaping further comprising forming a surface geometry of the mold according to the surface normals calculated for the non-imaging freeform optical device;
    filling the mold with substrate material to form a substrate in the shape of the mold;
    separating the mold and the substrate after the substrate material has conformed to the shape of the mold; and
    polishing the substrate.

2. A method as in claim 1, wherein calculating surface normals for the plurality of locations on the surface of the non-imaging freeform optical device comprises calculating surface normals based on reflectance from the non-imaging freeform optical device to the solar sensor cell.

3. A method as in claim 1, wherein calculating surface normals for the plurality of locations on the surface of the non-imaging freeform optical device comprises calculating surface normals based on refraction from the non-imaging freeform optical device to the solar sensor cell.

4. A method for designing a non-imaging freeform optical device for use in a high concentration photovoltaic device, the method comprising:
    identifying a concentration region relative the non-imaging freeform optical device for concentrating incident light from the non-imaging freeform optical device;
    initiating a first ray from a first edge of the concentration region toward a predetermined point on the non-imaging freeform optical device using a ray-tracing model;
    redirecting the first ray toward a first wavefront;
    initiating a second ray from a second wavefront that impinges on the predetermined point offset from an angular impingement of the first wavefront at the predetermined point by an angular view of a sun;
    redirecting the second ray from the non-imaging freeform optical device to a second edge of the non-imaging freeform optical device; and
    calculating a surface normal at the predetermined point for the non-imaging freeform optical device such that the first and second wavefronts are redirected to a surface of the non-imaging freeform optical device.

5. A method as in claim 4, wherein the non-imaging freeform optical device is a second optical device and the method includes redirecting the first ray from a first optical device after initiaing the first ray and before redirecting the first ray.

6. A method as in claim 5, further comprising calculating a surface normal of the first optical device.

7. A method as in claim 4, wherein the non-imaging freeform optical device is a first optical device and the method includes redirecting the second ray from a second optical device after redirecting the second ray and before calculating the surface normal.

8. A method as in claim 7, further comprising calculating a surface normal of the second optical device.

9. A method as in claim 4, wherein at least one of redirecting the first ray and redirecting the second ray comprises redirecting using a mirror to reflect the first ray or the second ray.

10. A method as in claim 4, wherein at least one of redirecting the first ray and redirecting the second ray comprises redirecting using a lens to refract the first ray or the second ray.

11. A method as in claim 4, wherein the steps of identifying the concentration region, initiating the first ray, redirecting the first ray, initiating the second ray, redirecting the second ray, and calculating the surface normal are repeated for multiple points on the non-imaging freeform optical device.

* * * * *